United States Patent
Tamaru et al.

(10) Patent No.: US 10,741,545 B2
(45) Date of Patent: Aug. 11, 2020

(54) SEMICONDUCTOR DEVICE

(71) Applicant: Panasonic Intellectual Property Management Co., Ltd., Osaka (JP)

(72) Inventors: Masaki Tamaru, Kyoto (JP); Kazuma Yoshida, Kyoto (JP); Michiya Otsuji, Shiga (JP); Tetsuyuki Fukushima, Hyogo (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/591,559

(22) Filed: Oct. 2, 2019

(65) Prior Publication Data

US 2020/0035669 A1    Jan. 30, 2020

Related U.S. Application Data

(63) Continuation of application No. PCT/JP2019/004626, filed on Feb. 8, 2019.
(Continued)

(51) Int. Cl.
*H01L 29/78* (2006.01)
*H01L 27/02* (2006.01)
(Continued)

(52) U.S. Cl.
CPC ...... *H01L 27/0277* (2013.01); *H01L 23/5228* (2013.01); *H01L 27/0255* (2013.01);
(Continued)

(58) Field of Classification Search
None
See application file for complete search history.

(56) References Cited

U.S. PATENT DOCUMENTS

2012/0098056 A1* 4/2012 Blanchard .......... H01L 29/7813
257/330
2016/0197178 A1* 7/2016 Grebs ................. H01L 29/7813
257/334
(Continued)

FOREIGN PATENT DOCUMENTS

JP       S57-133665 A    8/1982
JP       2002-368219 A   12/2002
(Continued)

OTHER PUBLICATIONS

International Search Report issued in corresponding International Patent Application No. PCT/JP2019/004626, dated Apr. 23, 2019, with English translation.
(Continued)

*Primary Examiner* — Minh Loan Tran
(74) *Attorney, Agent, or Firm* — McDermott Will & Emery LLP

(57) ABSTRACT

A semiconductor device includes a first transistor and a second transistor. The first transistor includes a first body layer and a first connection part. The second transistor includes a second body layer and a second connection part. A second impedance, which is, in a path between the second connection part and the second body layer, inclusive, a maximum impedance seen by the first source electrode in the second body layer, is greater than a first impedance, which is, in a path between the first connection part and the first body layer, inclusive, a maximum impedance seen by the first source electrode in the first body layer.

29 Claims, 14 Drawing Sheets

Related U.S. Application Data

(60) Provisional application No. 62/629,553, filed on Feb. 12, 2018.

(51) Int. Cl.
*H01L 23/522* (2006.01)
*H01L 27/06* (2006.01)
*H01L 29/06* (2006.01)
*H01L 29/08* (2006.01)
*H01L 29/10* (2006.01)
*H01L 29/417* (2006.01)
*H01L 29/423* (2006.01)
*H01L 29/866* (2006.01)

(52) U.S. Cl.
CPC ...... *H01L 27/0259* (2013.01); *H01L 27/0629* (2013.01); *H01L 27/0635* (2013.01); *H01L 29/0696* (2013.01); *H01L 29/0865* (2013.01); *H01L 29/1095* (2013.01); *H01L 29/41741* (2013.01); *H01L 29/4236* (2013.01); *H01L 29/7813* (2013.01); *H01L 29/866* (2013.01)

(56) References Cited

U.S. PATENT DOCUMENTS

| | | | | |
|---|---|---|---|---|
| 2016/0211361 A1* | 7/2016 | Nishimura | .......... | H01L 29/7805 |
| 2016/0359029 A1* | 12/2016 | Zeng | .................. | H01L 29/7397 |
| 2019/0067491 A1* | 2/2019 | Blanchard | ......... | H01L 29/66136 |

FOREIGN PATENT DOCUMENTS

| | | |
|---|---|---|
| JP | 2009-16725 A | 1/2009 |
| JP | 2010-263032 A | 11/2010 |

OTHER PUBLICATIONS

Written Opinion issued in corresponding International Patent Application No. PCT/JP2019/004626, dated Apr. 23, 2019.

* cited by examiner

SEMICONDUCTOR DEVICE

CROSS REFERENCE TO RELATED APPLICATIONS

This application is a U.S. continuation application of PCT International Patent Application Number PCT/JP2019/004626 filed on Feb. 8, 2019, claiming the benefit of priority of U.S. Provisional Patent Application No. 62/629,553 filed on Feb. 12, 2018, the entire contents of which are hereby incorporated by reference.

BACKGROUND

1. Technical Field

The present disclosure relates to a semiconductor device, and in particular to a semiconductor device including a vertical field effect transistor.

2. Description of the Related Art

In semiconductor devices including a transistor such as a vertical field effect transistor, it is desirable to improve electro-static discharge (ESD) tolerance. For example, Japanese Unexamined Patent Application Publication No. 2009-16725 discloses a configuration in which a second vertical MOS transistor whose gate and source are short-circuited is connected in parallel to a first vertical MOS transistor.

SUMMARY

In semiconductor devices, it is also desirable to improve second breakdown tolerance in addition to ESD tolerance described above.

In view of this, the present disclosure has an object to provide a semiconductor device that can improve both ESD tolerance and second breakdown tolerance.

A semiconductor device according to one aspect of the present disclosure includes: a first transistor, which is a vertical field effect transistor; a second transistor, which is a vertical transistor; and a first diode. The first transistor includes: a drift layer of a first conductivity type disposed on a semiconductor substrate; a first body layer of a second conductivity type different from the first conductivity type in an upper surface of the drift layer; a first source layer of the first conductivity type in an upper surface of the first body layer; a first source electrode electrically connected to the first source layer; a plurality of first trench parts, each of which extends in a first direction parallel to an upper surface of the semiconductor substrate and is selectively formed so as to, from the upper surface of the drift layer, penetrate through the first body layer and have a bottom in the drift layer; a plurality of first gate insulating films, each of which covers at least a portion of a surface of a corresponding first trench part from among the plurality of first trench parts; a plurality of first gate conductors, each of which is disposed on a corresponding first gate insulating film from among the plurality of first gate insulating films; and a first connection part that electrically connects the first body layer and the first source electrode. The second transistor includes: a second body layer of the second conductivity type in the upper surface of the drift layer; a second source layer of the first conductivity type in an upper surface of the second body layer and electrically connected to the first source electrode; and a second connection part that electrically connects the second body layer and the first source electrode. The first diode is electrically connected between the first source electrode and the plurality of first gate conductors. A second impedance is greater than a first impedance. The second impedance is, in a path between the second connection part and the second body layer, inclusive, a maximum impedance seen by the first source electrode in the second body layer, and the first impedance is, in a path between the first connection part and the first body layer, inclusive, a maximum impedance seen by the first source electrode in the first body layer.

This configuration makes it possible to improve second breakdown tolerance by reducing the first impedance of the first transistor. This configuration also makes it possible to turn the second transistor on when a surge voltage is applied, by increasing the second impedance of the second transistor. Thus, ESD tolerance can be improved. Accordingly, both ESD tolerance and second breakdown tolerance can be improved.

The present disclosure provides a semiconductor device that can improve both ESD tolerance and second breakdown tolerance.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

The embodiment described below shows a specific example of the present disclosure. The numerical values, shapes, materials, elements, the arrangement and connection of the elements, etc., indicated in the following embodiment are mere examples, and therefore do not intend to limit the present disclosure. Therefore, among elements in the following embodiment, those not recited in any of the broadest, independent claims are described as optional elements.

Note that the drawings are represented schematically and are not necessarily precise illustrations. Accordingly, for example, the figures are not necessarily to the same scale. Moreover, in the figures, the corners and edges of the elements are illustrated as straight lines, but due to manufacturing reasons, the corners and edges may be rounded. Such configurations fall within the scope of the present disclosure.

In the figures, elements that have essentially the same function share like reference signs. Accordingly, duplicate description may be omitted or simplified.

In the present disclosure, the terminology "A and B are electrically connected" includes configurations in which A and B are directly connected via wiring, configurations in which A and B are directly connected without wiring, configurations in which A and B are indirectly connected via a resistive component (resistor element or resistive wire), and configurations in which A and B are formed in the same conducting layer.

Embodiment

[1. Circuit Configuration of Semiconductor Device]

Hereinafter, the structure of a semiconductor device according to the present embodiment will be described. The semiconductor device according to the present disclosure is a facedown mountable, chip-size-package (CSP) type multi-transistor chip including two vertical metal oxide semiconductor (MOS) transistors formed on a semiconductor substrate. The two vertical MOS transistors are each a power transistor and what is called a trench MOS field effect transistor (FET).

Figure 1:
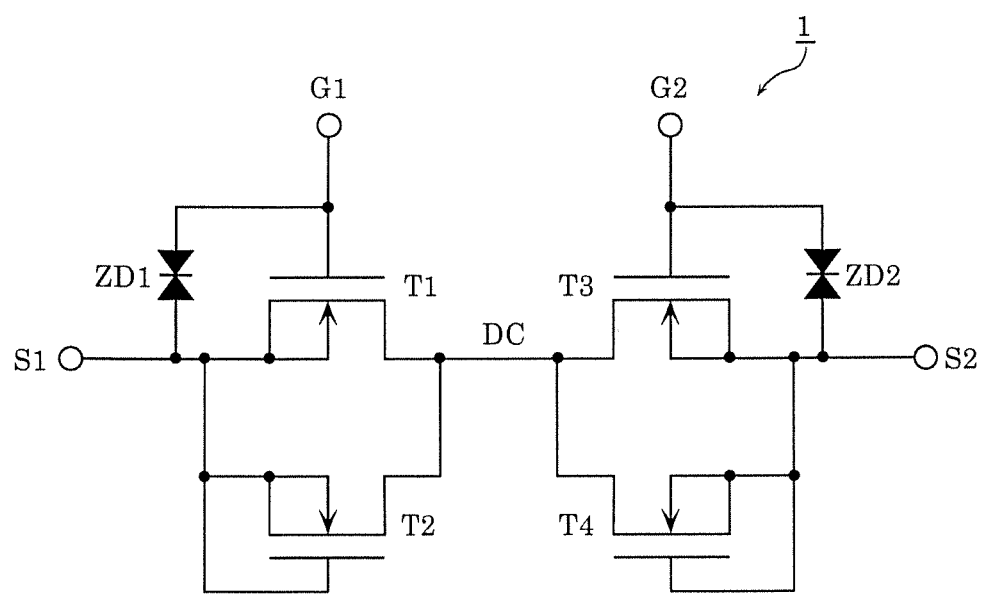
FIG. 1 is a circuit diagram of a semiconductor device according to an embodiment.

FIG. 1 is a circuit diagram illustrating an example of the circuit configuration of semiconductor device 1 according to the present embodiment.

As illustrated in FIG. 1, semiconductor device 1 includes first gate terminal G1 (hereinafter referred to as gate terminal G1), second gate terminal G2 (hereinafter referred to as gate terminal G2), first source terminal S1 (hereinafter referred to as source terminal S1), second source terminal S2 (hereinafter referred to as source terminal S2), first transistor T1, second transistor T2, third transistor T3, fourth transistor T4, first diode ZD1, and second diode ZD2.

First transistor T1, second transistor T2, third transistor T3, and fourth transistor T4 are vertical field effect transistors, and first diode ZD1 and second diode ZD2 are, for example, zener diodes.

First transistor T1 includes a plurality of first gate conductors 118 (to be described later), first source electrode 115 (to be described later), and common drain electrode DC. First gate conductors 118 are electrically connected to gate terminal G1, and first source electrode 115 is electrically connected to source terminal S1.

Second transistor T2 includes a plurality of second gate conductors 128 (to be described later), first source electrode 115, and common drain electrode DC. Second gate conductors 128 are electrically connected to source terminal S1.

Third transistor T3 includes a plurality of third gate conductors 138 (to be described later), second source electrode 135 (to be described later), and common drain electrode DC. Third gate conductors 138 are electrically connected to gate terminal G2, and second source electrode 135 is electrically connected to source terminal S2.

Fourth transistor T4 includes a plurality of fourth gate conductors 148 (to be described later), second source electrode 135, and common drain electrode DC. Fourth gate conductors 148 are electrically connected to source terminal S2.

First diode ZD1 is electrically connected between gate terminal G1 and source terminal S1, and second diode ZD2 is electrically connected between gate terminal G2 and source terminal S2.

[2. Configuration of Semiconductor Device]

Figure 2:
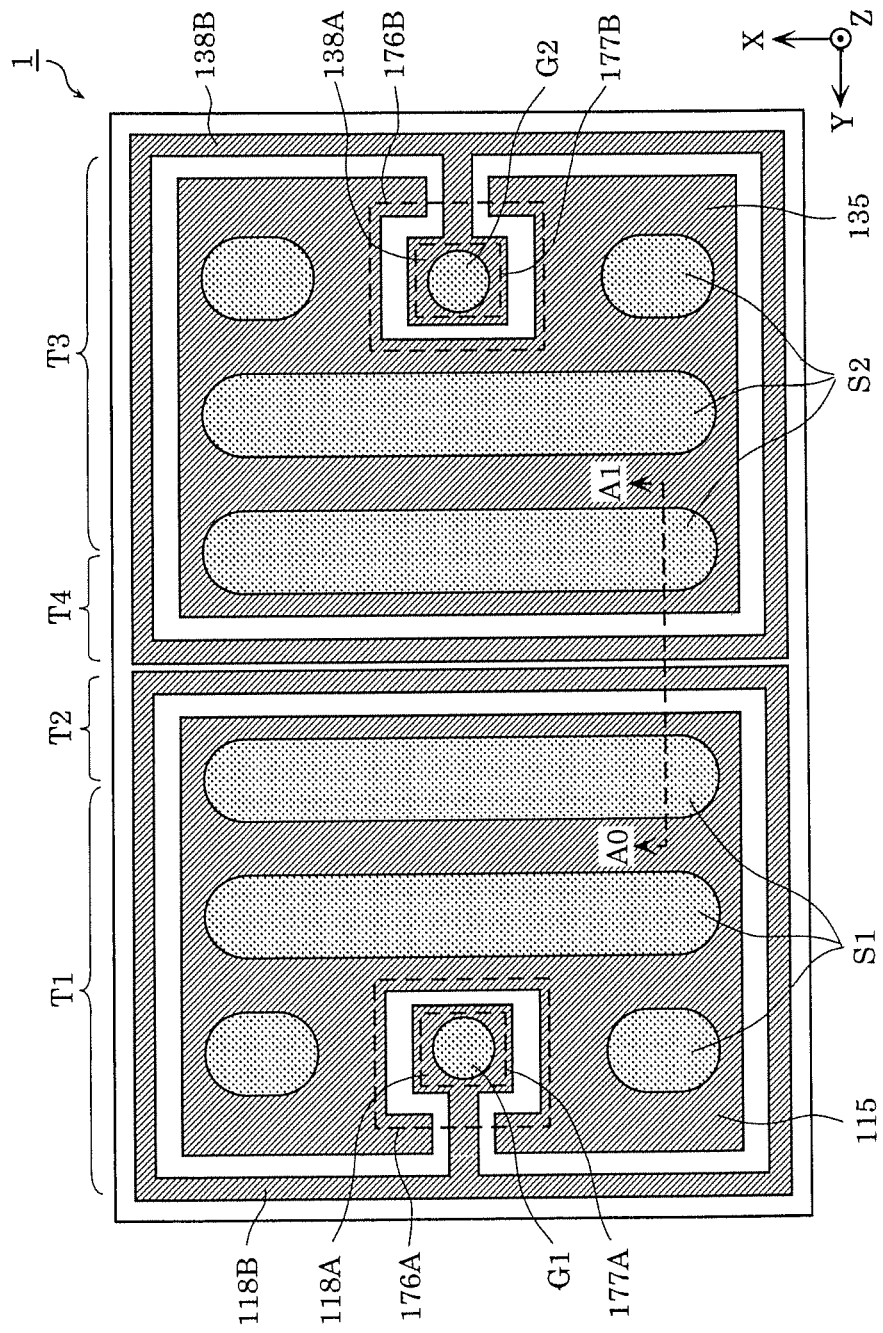
FIG. 2 is a see-through view from the top of a semiconductor device according to an embodiment.

FIG. 2 is a see-through view from the top of semiconductor device 1 according to the present embodiment.

Hereinafter, as illustrated in FIG. 2, a first direction parallel to the upper surface of the semiconductor substrate is referred to as an X direction, a second direction parallel to the upper surface of the semiconductor substrate and orthogonal to the X direction is referred to as a Y direction, and a third direction perpendicular to the upper surface of the semiconductor substrate is referred to as a Z direction.

As illustrated in FIG. 2, gate terminal G1, source terminal S1, source terminal S2, and gate terminal G2 are disposed on semiconductor device 1 in order in the Y direction. Moreover, first transistor T1, second transistor T2, fourth transistor T4, and third transistor T3 are disposed in order in the Y direction.

Semiconductor device 1 includes first source electrode 115, second source electrode 135, first gate electrode 118A, second gate electrode 138A, first gate wiring 118B, and second gate wiring 138B.

The upper surface of semiconductor device 1 is covered by a protective film. In a plan view of semiconductor device 1, the protective film has openings in a portion of each region corresponding to first source electrode 115, second source electrode 135, first gate electrode 118A, and second gate electrode 138A. These opening regions serve as source terminal S1, source terminal S2, gate terminal G1, and gate terminal G2, respectively.

First gate wiring 118B is wiring that electrically connects first gate electrode 118A and first gate conductors 118, and second gate wiring 138B is wiring that electrically connects second gate electrode 138A and third gate conductors 138.

Although not illustrated in FIG. 2, first diode ZD1 is formed in the region between first gate electrode 118A and first source electrode 115, and second diode ZD2 is formed in the region between second gate electrode 138A and second source electrode 135.

Figure 3:
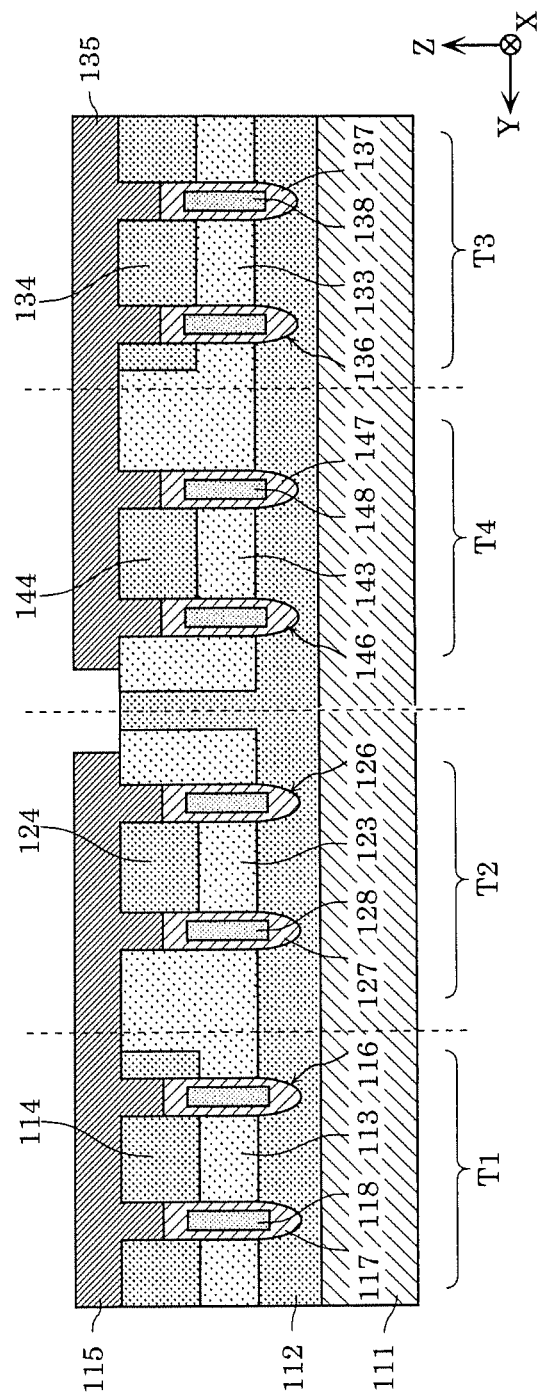
FIG. 3 is a cross-sectional view of first through fourth transistors according to an embodiment.

FIG. 3 is a cross-sectional view showing the plane taken along line A0-A1 in FIG. 2.

As illustrated in FIG. 3, first transistor T1 includes semiconductor substrate 111, drift layer 112 of a first conductivity type, first body layer 113 of a second conductivity type, first source layer 114 of the first conductivity type, first source electrode 115, a plurality of first trench parts 116, a plurality of first gate insulating films 117, and a plurality of first gate conductors 118.

Semiconductor substrate 111 comprises silicon containing an impurity of the first conductivity type. For example, semiconductor substrate 111 may be an n-type silicon substrate. Here, the first conductivity type is n type, and the second conductivity type different from the first conductivity type is p type. The first conductivity type impurity may be, for example, arsenic or phosphorous, and the second conductivity type impurity may be, for example, boron.

Moreover, semiconductor substrate 111 is common drain electrode DC serving as the drain electrode for each of first transistor T1, second transistor T2, third transistor T3, and fourth transistor T4.

Drift layer 112 is formed on semiconductor substrate 111. Drift layer 112 is a semiconductor layer containing a first conductivity type impurity in a lower concentration than the concentration of a first conductivity type impurity in semiconductor substrate 111. For example, drift layer 112 may be formed by epitaxial growth.

First body layer 113 is a semiconductor layer that contains a second conductivity type impurity and is formed in the upper surface of drift layer 112 by impurity implantation.

First source layer 114 is a semiconductor layer that contains a first conductivity type impurity and is formed in the upper surface of first body layer 113 by impurity implantation.

First source electrode 115 is formed in contact with the upper surface of first source layer 114, and is electrically connected to first source layer 114 and first body layer 113. First source electrode 115 may comprise a metal material including, for example, at least one of aluminum, copper, gold, and silver.

Each first trench part 116 extends in the X direction and is selectively formed so as to, from the upper surface of drift layer 112, penetrate through first body layer 113 and have a bottom in drift layer 112.

Each first gate insulating film 117 is formed so as to cover at least part of the surface of a corresponding first trench part 116. Each first gate conductor 118 is formed on a corresponding first gate insulating film 117.

As illustrated in FIG. 3, second transistor T2 includes semiconductor substrate 111, drift layer 112 of the first conductivity type, second body layer 123 of the second conductivity type, second source layer 124 of the first conductivity type, first source electrode 115, a plurality of second trench parts 126, a plurality of second gate insulating films 127, and a plurality of second gate conductors 128.

Second body layer 123 is a semiconductor layer that contains a second conductivity type impurity and is formed in the upper surface of drift layer 112 by impurity implantation, and is electrically connected to first source electrode 115.

Second source layer 124 is a semiconductor layer that contains a first conductivity type impurity and is formed in the upper surface of second body layer 123 by impurity implantation, and is electrically connected to first source electrode 115.

Each second trench part 126 extends in the X direction and is selectively formed so as to, from the upper surface of drift layer 112, penetrate through second body layer 123 and have a bottom in drift layer 112.

Each second gate insulating film 127 is formed so as to cover at least part of the surface of a corresponding second trench part 126. Each second gate conductor 128 is formed on a corresponding second gate insulating film 127.

The pitch between the rows of second trench parts 126 (the regular interval at which second trench parts 126 are arranged in the Y direction) may be equal to the pitch between rows of first trench parts 116. In such cases, since second transistor T2 can be configured the same as first transistor. T1, second transistor T2 can be easily designed and manufactured.

Third transistor T3 is configured the same as first transistor T1, and fourth transistor T4 is configured the same as second transistor T2. Moreover, third transistor T3 and fourth transistor T4 each include semiconductor substrate 111 and drift layer 112, which are shared in common with first transistor T1 and second transistor T2.

Third body layer 133, third source layer 134, second source electrode 135, third trench parts 136, third gate insulating films 137, and third gate conductors 138 included in third transistor T3 respectively correspond to first body layer 113, first source layer 114, first source electrode 115, first trench parts 116, first gate insulating films 117, and first gate conductors 118 included in first transistor T1. Moreover, fourth body layer 143, fourth source layer 144, second source electrode 135, fourth trench parts 146, fourth gate insulating films 147, and fourth gate conductors 148 included in fourth transistor T4 respectively correspond to second body layer 123, second source layer 124, first source electrode 115, second trench parts 126, second gate insulating films 127, and second gate conductors 128 included in second transistor T2.

Figure 4:
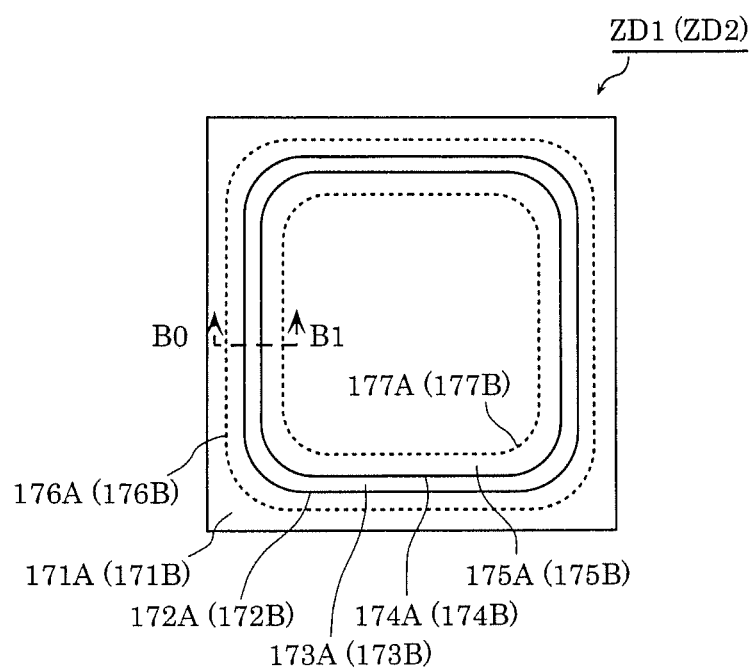
FIG. 4 is a see-through view from the top of a diode according to an embodiment.
Figure 5:
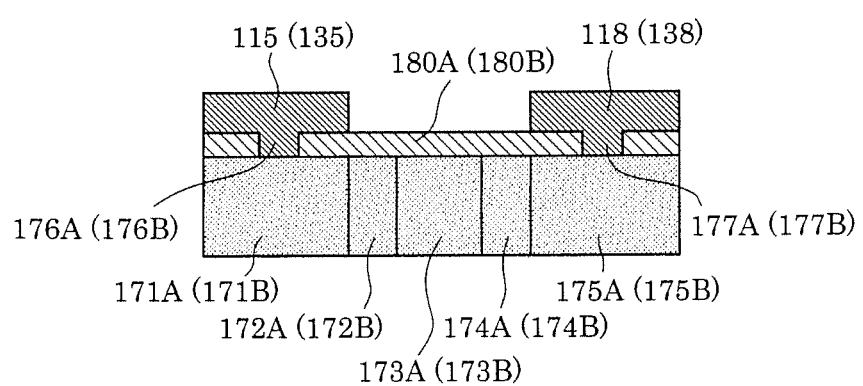
FIG. 5 is a cross-sectional view of a diode according to an embodiment.

FIG. 4 is a see-through view from the top of first diode ZD1 (second diode ZD2). FIG. 5 is a cross-sectional view showing the plane taken along line B0-B1 in FIG. 4.

As illustrated in FIG. 5, first diode ZD1 and second diode ZD2 are bidirectional zener diodes including a first conductivity type polysilicon layer and a second conductivity type polysilicon layer. First diode ZD1 and second diode ZD2 are formed on an insulating layer on drift layer 112 (not shown in FIG. 5).

As illustrated in FIG. 4 and FIG. 5, first diode ZD1 includes, aligned in a horizontal direction (the X direction or the Y direction) layer 171A, layer 173A, and layer 175A, which are first conductivity type polysilicon layers, and layer 172A and layer 174A, which are second conductivity type polysilicon layers. Insulating film 180A is formed on layers 171A through 175A. Layer 171A is in contact with and connected to first source electrode 115 via connection part 176A, and layer 175A is in contact with and connected to first gate electrode 118A via connection part 177A.

Second diode ZD2 is configured the same as first diode ZD1 described above; layer 171B is in contact with and connected to second source electrode 135 via connection part 176B, and layer 175B is in contact with and connected to second gate electrode 138A via connection part 177B.

[3. Operations Performed by Semiconductor Device when Surge Voltage is Applied]

Next, the principle that allows for semiconductor device 1 according to the present embodiment to improve ESD tolerance will be described.

First, consider a case in which a positive surge voltage is applied between source terminal S2 and gate terminal G1 (hereinafter also phrased as "when a surge voltage is applied between S2-G1") when second transistor T2 is not provided. In such a case, surge current flows from source terminal S2 to drift layer 112 and semiconductor substrate 111 via third body layer 133. However, when first transistor T1 is in an off state, the conducting channel is not formed and, under the condition that the second breakdown tolerance of first transistor T1 is high, the parasitic bipolar transistor configured of drift layer 112, first body layer 113, and first source layer 114 also does not turn on. Accordingly, a high voltage is applied to the portion of each first gate insulating film 117 between (i) drift layer 112 and semiconductor substrate 111 and (ii) a corresponding first gate conductor 118, causing first gate insulating films 117 to breakdown. In other words, when second transistor T2 is not provided, under the condition that the second breakdown tolerance of first transistor T1 is high, the ESD tolerance of the semiconductor device is low.

In contrast, with semiconductor device 1 according to the present embodiment, since second transistor T2 having a second breakdown tolerance lower than the second breakdown tolerance of first transistor T1 is provided, even under the condition that the second breakdown tolerance of first transistor T1 is high, when a surge voltage is applied between S2-G1, first gate insulating films 117 do not breakdown.

Specifically, since the surge current when a surge voltage is applied between S2-G1 flows along a path from source terminal S2, to third body layer 133, to drift layer 112 and semiconductor substrate 111, to parasitic bipolar transistor TP2 (drift layer 112, second body layer 123, and second source layer 124) included in transistor T2, to diode ZD1, and then to gate terminal G1, first gate insulating films 117 are not applied with a high voltage and do not breakdown.

Moreover, in second transistor T2, first source electrode 115 and second gate conductors 128 are connected via a short-circuit connection, and since second transistor T2 is in an off state when semiconductor device 1 normally operates, second transistor T2 does not affect the normal operation of first transistor T1.

Hereinbefore, although the relationship between first transistor T1 and second transistor T2 when a surge voltage is applied between S2-G1 has been described, the same also applies to the relationship between third transistor T3 and fourth transistor T4 when a positive surge voltage is applied between source terminal S1 and gate terminal G2 (hereinafter also phrased as "when a surge voltage is applied between S1-G2").

As described above, with the configuration according to the present embodiment, since second transistor T2 (fourth transistor T4) having a second breakdown tolerance that is lower than the second breakdown tolerance of first transistor T1 (third transistor T3) is provided, the ESD tolerance of the semiconductor device can be improved even when the second breakdown tolerance of first transistor T1 (third transistor T3) is high. In other words, both the second breakdown tolerance of first transistor T1 and third transistor T3 can be improved and the ESD tolerance of the semiconductor device can be improved.

Moreover, as illustrated in FIG. 2 and FIG. 3, in a plan view, second transistor T2 is disposed between gate terminal G1 and source terminal S2, and fourth transistor T4 is disposed between gate terminal G2 and source terminal S1.

With this configuration, since the surge current when a surge voltage is applied between S2-G1 flows along a path from source terminal S2, to third body layer 133, to drift layer 112 and semiconductor substrate 111, to parasitic bipolar transistor TP2 (drift layer 112, second body layer 123, and second source layer 124) included in transistor T2, to diode ZD1, and then to gate terminal G1, and thus flows through a location distanced from first gate insulating films 117, the damage to first gate insulating films 117 caused by surge current can be reduced. In other words, the addition of second transistor T2 makes it possible to exclude the semiconductor regions (first body layer 113) in the vicinity of first gate insulating films 117 from the path of the surge current when a surge voltage is applied between S2-G1. Moreover, similarly, damage to third gate insulating films 137 can be reduced when a surge voltage is applied between S1-G2 as well. Accordingly, the ESD tolerance of the semiconductor device can be improved.

Moreover, as illustrated in FIG. 2 and FIG. 3, in a plan view, second transistor T2 and fourth transistor T4 are disposed between first transistor T1 and third transistor T3.

With this configuration, since the surge current when a surge voltage is applied between S2-G1 flows along a path from source terminal S2, to fourth body layer 143, to drift layer 112 and semiconductor substrate 111, to parasitic bipolar transistor TP2 (drift layer 112, second body layer 123, and second source layer 124) included in transistor T2, to diode ZD1, and then to gate terminal G1, and thus flows through a location distanced from first gate insulating films 117 and third gate insulating films 137, the damage to first gate insulating films 117 and third gate insulating films 137 caused by surge current can be reduced. In other words, the addition of fourth transistor T4 in addition to second transistor T2 makes it possible to exclude the semiconductor regions (third body layer 133) in the vicinity of third gate insulating films 137 in addition to the semiconductor regions (first body layer 113) in the vicinity of first gate insulating films 117 from the path of the surge current when a surge voltage is applied between S2-G1. Moreover, similarly, damage to first gate insulating films 117 and third gate insulating films 137 can be reduced when a surge voltage is applied between S1-G2 as well. Accordingly, the ESD tolerance of the semiconductor device can be improved.

Moreover, first diode ZD1, which is the path of surge current when a surge voltage is applied between S2-G1, is formed in the region of closest proximity between first gate electrode 118A and first source electrode 115, in a position across the insulating layer on drift layer 112.

With this configuration, the semiconductor regions (first body layer 113) in the vicinity of first gate insulating films 117 can be excluded from the path of surge current when a surge voltage is applied between S2-G1, whereby damage to first gate insulating films 117 can be reduced.

Moreover, second diode ZD2, which is the path of surge current when a surge voltage is applied between S1-G2, is formed in the region of closest proximity between second gate electrode 138A and second source electrode 135, in a position across the insulating layer on drift layer 112.

Moreover, just like described above, damage to third gate insulating films 137 can be reduced. Accordingly, the ESD tolerance of the semiconductor device can be improved.

[4. Transistor Configuration]

Next, the configuration of second transistor T2 having a lower second breakdown tolerance than the second breakdown tolerance of first transistor T1, that is to say, the configuration of second transistor T2 including parasitic bipolar transistor TP2 that is easier to turn on than parasitic bipolar transistor TP1 included in first transistor T1 will be described.

(MOS Orthogonal Type)

Figure 6:
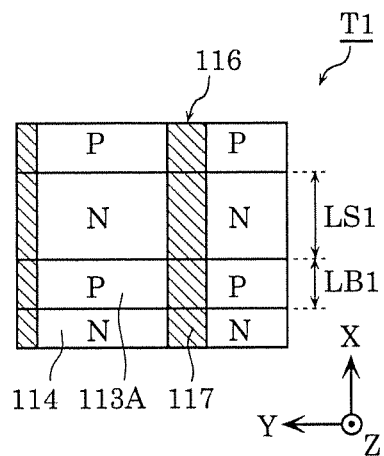
FIG. 6 is a plan view of the configuration of an approximate single unit of a first transistor according to an embodiment.
Figure 7:
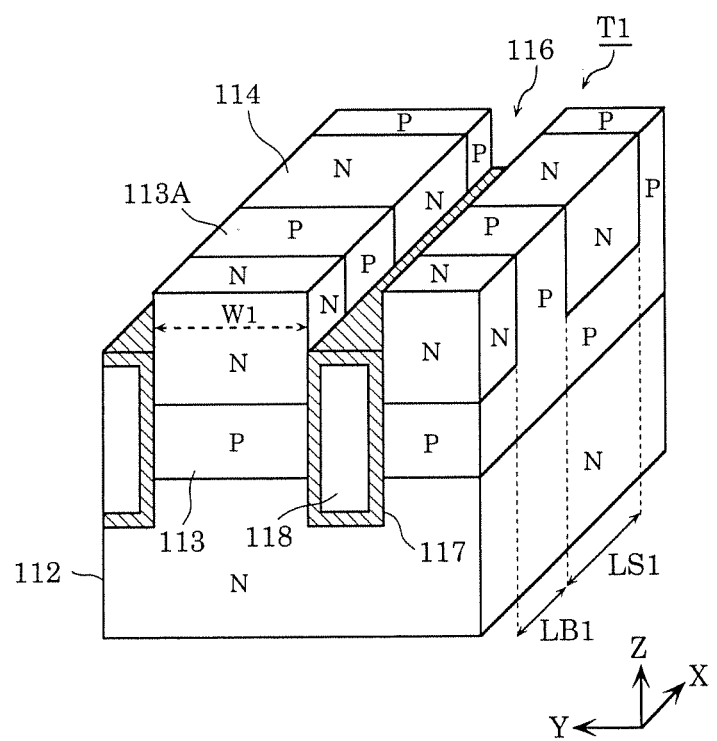
FIG. 7 is a perspective view of the configuration of an approximate single unit of a first transistor according to an embodiment.

FIG. 6 is a plan view and FIG. 7 is a perspective view of the configuration of an approximate single unit of first transistor T1, which is repeatedly formed in the X direction and the Y direction of semiconductor device 1. Similarly, FIG. 8 is a plan view and FIG. 9 is a perspective view of the configuration of an approximate single unit of second transistor T2.

Note that semiconductor substrate 111, first source electrode 115, and second source electrode 135 are omitted from the illustrations of FIG. 6 through FIG. 9. Moreover, semiconductor substrate 111, first source electrode 115, and second source electrode 135 are similarly omitted from the plan views and perspective views to be described hereinafter.

As illustrated in FIG. 6 and FIG. 7, first transistor T1 includes first connection part 113A that electrically connects first body layer 113 and first source electrode 115. First connection part 113A is the region of first body layer 113 in which first source layer 114 is not formed, and contains the same second conductivity type impurity as first body layer 113. First source layer 114 and first connection part 113A are alternately and repeatedly formed in the X direction.

Figure 8:
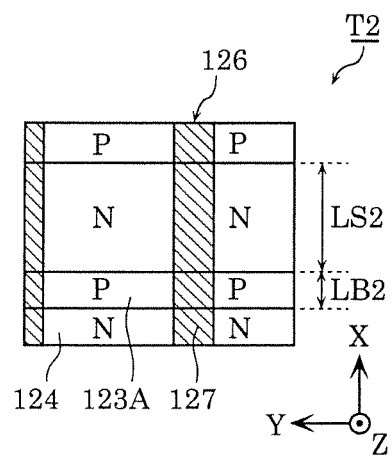
FIG. 8 is a plan view of the configuration of an approximate single unit of the second transistor according to an embodiment.
Figure 9:
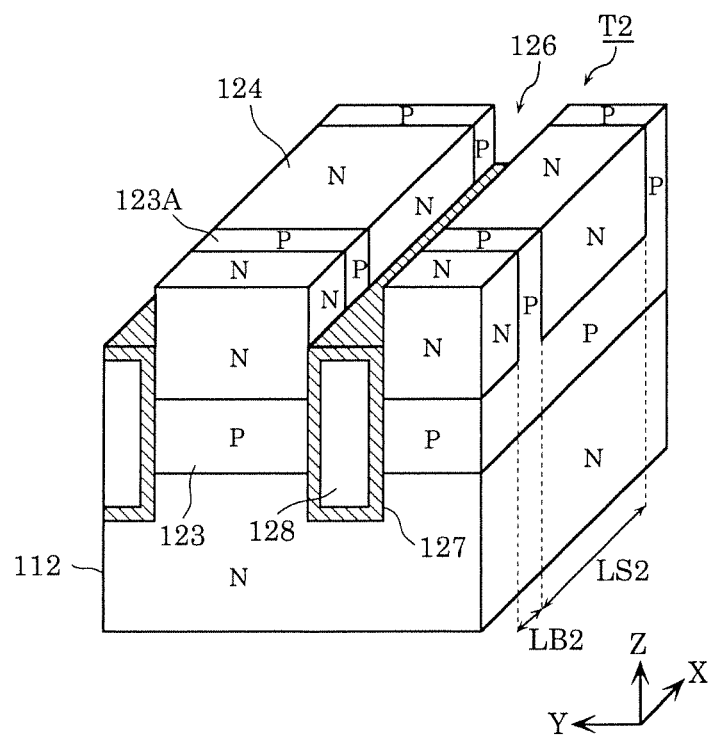
FIG. 9 is a perspective view of the configuration of an approximate single unit of the second transistor according to an embodiment.

As illustrated in FIG. 8 and FIG. 9, second transistor T2 includes second connection part 123A that electrically connects second body layer 123 and first source electrode 115. Second connection part 123A is the region of second body layer 123 in which second source layer 124 is not formed, and contains the same second conductivity type impurity as second body layer 123. Second source layer 124 and second connection part 123A are alternately and repeatedly formed in the X direction.

Here, the length of second source layer 124 in the X direction (hereinafter also denoted as LS2) is longer than the length of first source layer 114 in the X direction (hereinafter also denoted as LS1). Here, when the length of second connection part 123A in the X direction (hereinafter also denoted as LB2) and the length of first connection part 113A in the X direction (hereinafter also denoted as LB1) are the same, the ratio of LS2 and LB2, i.e., LS2/LB2, is greater than the ratio of LS1 and LB1, i.e., LS1/LB1. Note that hereinafter the ratio LS1/LB1 and the ratio of LS2/LB2 are also denoted as SB ratio.

Examples of sizes of various components in semiconductor device 1 are as follows: the thickness of drift layer 112 is approximately 2.5 µm, the thickness of first body layer 113 is approximately 1.0 µm, the thickness of first source layer 114 is approximately 0.5 µm, the width of each first trench part 116 (the Y direction length) is approximately 0.3 µm, the interval between first trench parts 116 (W1 in FIG. 7) is approximately 0.2 µm, LB1 and LB2 are approximately 1.0 µm, LS1 when the SB ratio is 6 is approximately 6.0 µm, and LS2 when the SB ratio is 24 is approximately 24 µm.

Figure 10:
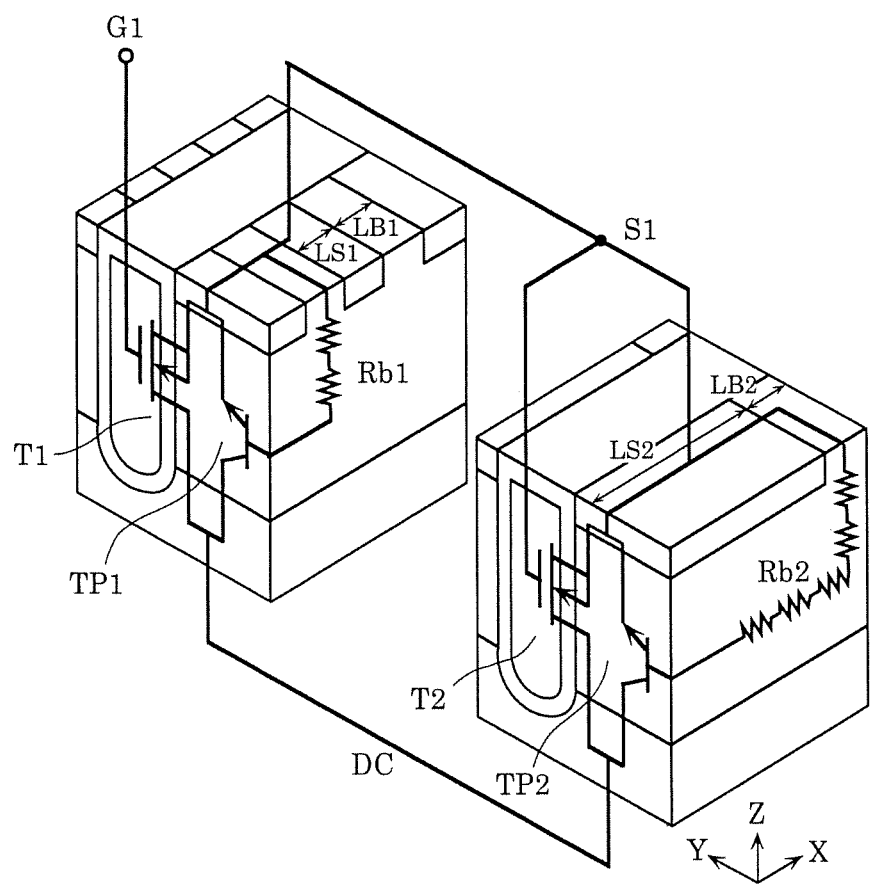
FIG. 10 schematically illustrates the configuration and circuit of first and second transistors according to an embodiment.

FIG. 10 illustrates operations of the parasitic bipolar transistors in first transistor T1 and second transistor T2.

As illustrated in FIG. 10, since base resistance Rb1 of parasitic bipolar transistor TP1 in first transistor T1 is dependent on LS1, and base resistance Rb2 of parasitic bipolar transistor TP2 in second transistor T2 is dependent on LS2, if LS2 is greater than LS1, then base resistance Rb2 is greater than base resistance Rb1. Here, "base resistance Rb2 is greater than base resistance Rb1" means that base resistance Rb2, which is, along the path between second body layer 123 and second connection part 123A, inclusive, the maximum impedance seen by first source electrode 115 in second body layer 123 (hereinafter also referred to as second impedance), is greater than base resistance Rb1, which is, along the path between first body layer 113 and first connection part 113A, inclusive, the maximum impedance seen by first source electrode 115 in first body layer 113 (hereinafter also referred to as first impedance).

Figure 11:
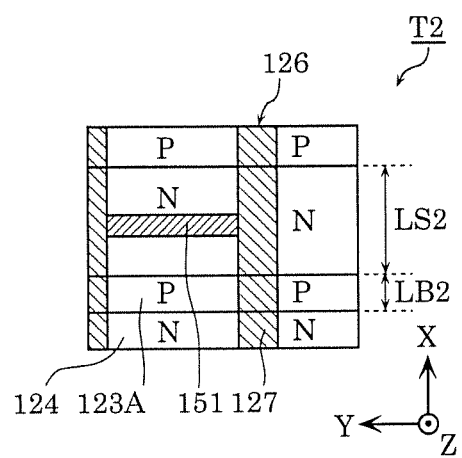
FIG. 11 is a plan view of an example of second impedance according to an embodiment.

FIG. 11 is a plan view illustratively showing the location of the second impedance in second transistor T2. The location of the second impedance is a location farthest from second connection part 123A, in a plan view is location 151, and depthwise (in the negative Z direction), is the deepest point of second body layer 123 (not shown in the figure). Here, since location 151 is in the center of second source layer 124 in the X direction, the greater LS2 is or the greater SB ratio LS2/LB2 is, the greater the second impedance is. Note that this also applies to the first impedance in first transistor T1 as well.

As described above, if LS2 is greater than LS1, and base resistance Rb2 is greater than base resistance Rb1 or SB ratio LS2/LB2 is greater than SB ratio LS1/LB1, parasitic bipolar transistor TP2 turns on more easily than parasitic bipolar transistor TP1.

In this way, in semiconductor device 1 according to present embodiment, the SB ratio of the principal transistor (first transistor T1) is set low, which secures a high second breakdown tolerance of the principal transistor. Moreover, semiconductor device 1 according to the present embodiment is provided with an ESD protection transistor (second transistor T2) that does not operate under normal operation and whose SB ratio is set high, which ensures the ESD tolerance of semiconductor device 1. Accordingly, both second breakdown tolerance and ESD tolerance can be ensured.

Figure 12:
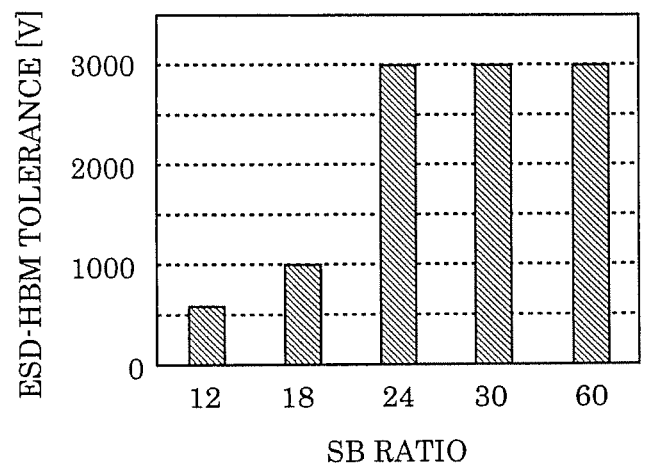
FIG. 12 is a graph of ESD tolerance relative to SB ratio according to an embodiment.
Figure 13:
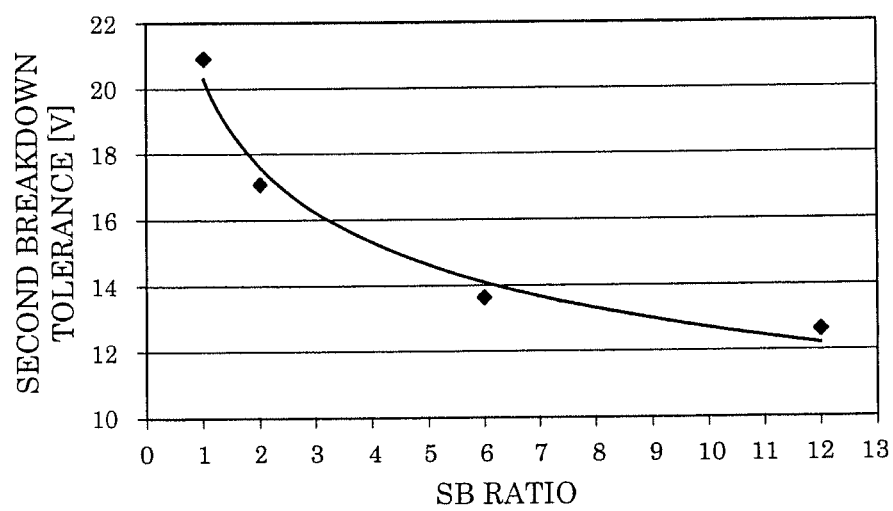
FIG. 13 is a graph of second breakdown tolerance relative to SB ratio according to an embodiment.

FIG. 12 is a graph of ESD tolerance characteristics in Human Body Model (HBM) mode relative to the SB ratio of second transistor T2 in a prototype of semiconductor device 1. FIG. 13 is a graph of second breakdown tolerance characteristics relative to the SB ratio of first transistor T1 when the applied current value is 13 A.

Based on FIG. 12, one can see that the ESD tolerance can reach 3000 V or higher when the SB ratio of second transistor T2 is 24 or higher, and based on FIG. 13, one can see that the second breakdown tolerance can reach 14 V or higher when the SB ratio of first transistor T1 is 6 or lower. Note that an ESD tolerance value of 3000 V or higher and a second breakdown tolerance value of 14 V or higher are values desired for product specifications.

Accordingly, LS2 may be at least 24 times greater than LB2. Moreover, LS1 may be at most 6 times greater than LB1.

Note that in the above description, first connection part 113A and second connection part 123A are each described as a semiconductor containing a second conductivity type impurity, but one or both may be first source electrode 115. In particular, when first connection part 113A is first source electrode 115 and second connection part 123A is a semiconductor containing a second conductivity type impurity, the second impedance can be easily increased.

(MOS Parallel Type)

In the description above, as illustrated in, for example, FIG. 6 and FIG. 7, an example is given in which first source layer 114 is divided by first connection part 113A in the extension direction of first gate conductors 118 (i.e., the X direction) (hereinafter, this example is also referred to as the orthogonal type), but the same technique can be applied to a configuration in which first source layer 114 is divided in a direction orthogonal to the extension direction of first gate conductors 118 (i.e., the Y direction) (hereinafter, this configuration is also referred to as the parallel type).

Figure 14:
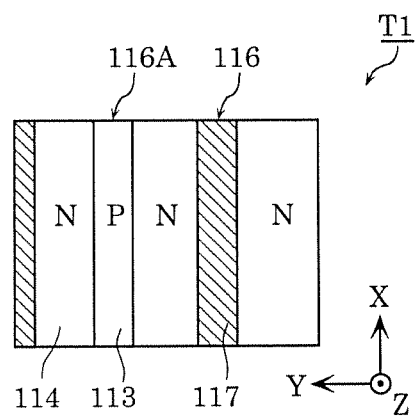
FIG. 14 is a plan view of the configuration of an approximate single unit of a first transistor according to an embodiment.
Figure 15:
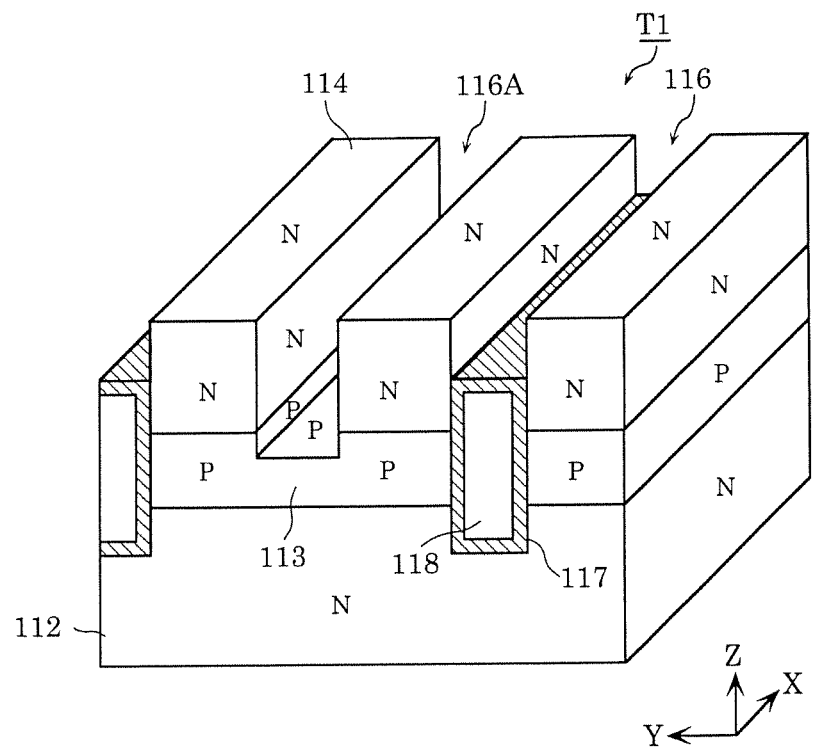
FIG. 15 is a perspective view of the configuration of an approximate single unit of the first transistor according to an embodiment.

FIG. 14 is a plan view and FIG. 15 is a perspective view of the configuration of an approximate single unit of a parallel type first transistor T1, which is repeatedly formed in the X direction and the Y direction of semiconductor device 1. Similarly, FIG. 16 is a plan view and FIG. 17 is a perspective view of the configuration of an approximate single unit of a parallel type second transistor T2.

In the parallel type first transistor T1, as illustrated in FIG. 14 and FIG. 15, between adjacent first trench parts 116, a plurality of first source layers 114 that extend in the X direction are arranged in the Y direction. The first connection part is disposed between adjacent first source layers 114 disposed between adjacent first trench parts 116, and extends in the X direction. Specifically, trench part 116A is formed between adjacent first source layers 114 disposed between adjacent first trench parts 116, and first source electrode 115 (not shown in FIG. 14 and FIG. 15) is embedded in trench part 116A. First source electrode 115 embedded in trench part 116A corresponds to the first connection part.

Figure 16:
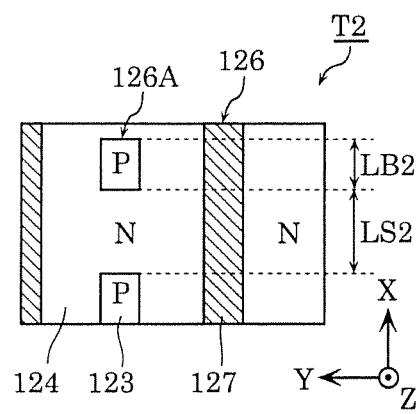
FIG. 16 is a plan view of the configuration of an approximate single unit of a second transistor according to an embodiment.
Figure 17:
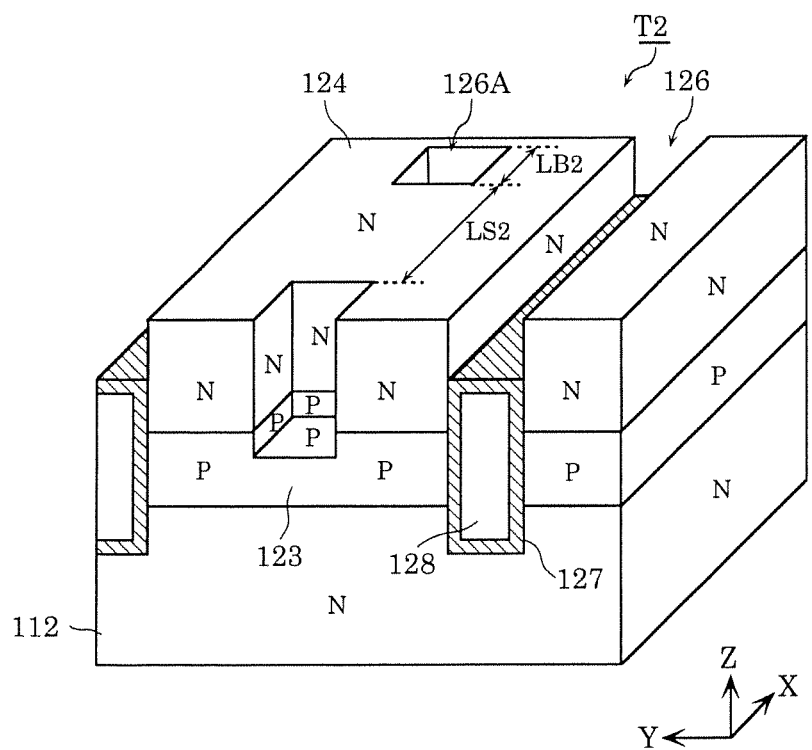
FIG. 17 is a perspective view of the configuration of an approximate single unit of the second transistor according to an embodiment.

In the parallel type second transistor T2, as illustrated in FIG. 16 and FIG. 17, between adjacent second trench parts 126, a plurality of second connection parts are arranged at regular intervals in the X direction. Specifically, a plurality of trench parts 126A are formed at regular intervals in the X direction, and first source electrodes 115 (not shown in FIG. 16 and FIG. 17) are embedded in trench parts 126A. First source electrodes 115 embedded in trench parts 126A correspond to the plurality of second connection parts.

The SB ratio in the parallel type second transistor T2 is, as illustrated in FIG. 16 and FIG. 17, the ratio between LS2, which is the interval between trench parts 126A in the X direction, and length LB2 of each trench part 126A.

Figure 18:
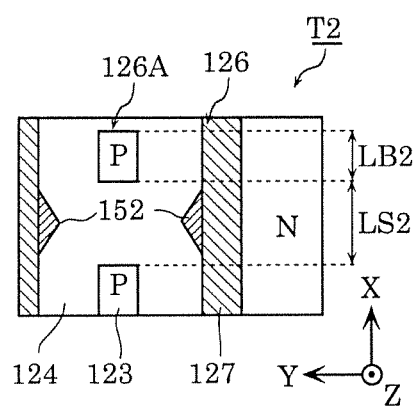
FIG. 18 is a plan view of an example of second impedance according to an embodiment.

FIG. 18 is a plan view illustratively showing the location of the second impedance in the parallel type second transistor T2. The location of the second impedance is a location farthest from trench part 126A, in a plan view is location 152, and depthwise (in the negative Z direction), is the deepest point of second body layer 123 (not shown in the figure). Here, since location 152 is in the center of second source layer 124 in the X direction, the greater LS2 is or the greater SB ratio LS2/LB2 is, the greater the second impedance is. Note that the location of the first impedance in the parallel type first transistor T1 is, with reference to FIG. 14, a location farthest from trench part 116A, in a plan view, is on the first source layer 114 side of the interface between first source layer 114 and first trench part 116, and depthwise (in the negative Z direction), is the deepest point of first body layer 113.

Moreover, the same ESD tolerance characteristics as those shown in FIG. 12 are obtained with the parallel type configuration as well. Accordingly, LS2 may be at least 24 times greater than LB2.

Note that in the examples illustrated in FIG. 15 and FIG. 17, first source electrode 115 is described as being embedded in trench part 116A and trench parts 126A, but a semiconductor layer containing a second conductivity type impurity may be embedded in one or both of trench part 116A and trench parts 126A. In particular, when first source electrode 115 is embedded in trench part 116A and a semiconductor layer containing a second conductivity type impurity is embedded in trench parts 126A, the second impedance can be easily increased.

(Bipolar Type)

Figure 19:
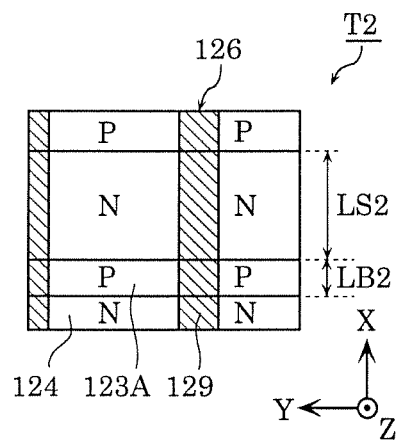
FIG. 19 is a plan view of the configuration of an approximate single unit of a second transistor according to an embodiment.
Figure 20:
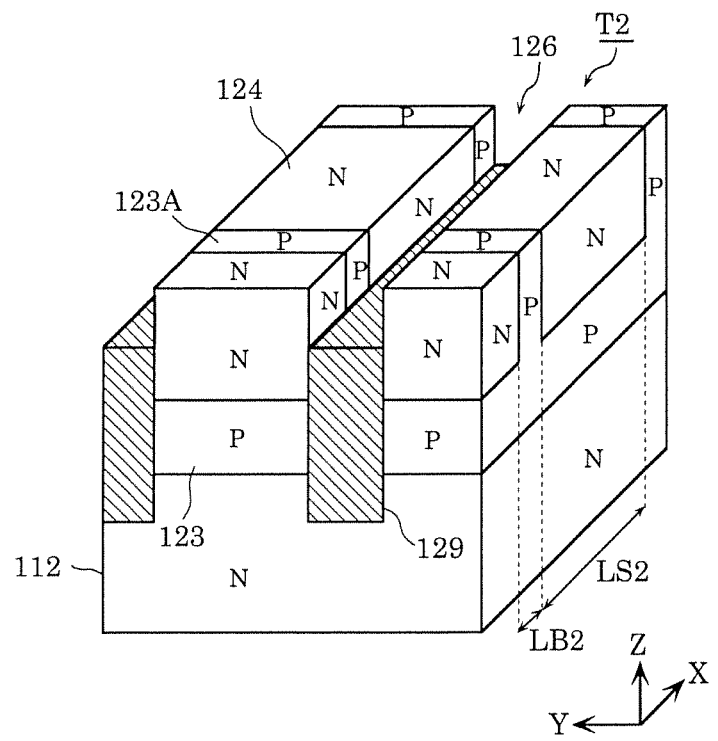
FIG. 20 is a perspective view of the configuration of an approximate single unit of the second transistor according to an embodiment.
Figure 21:
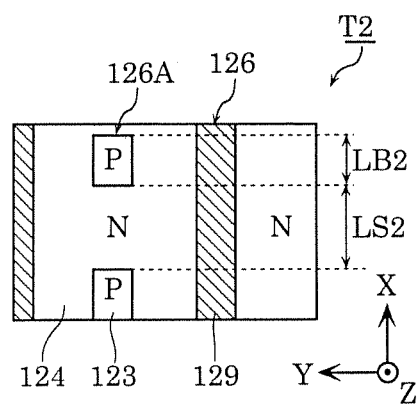
FIG. 21 is a plan view of the configuration of an approximate single unit of a second transistor according to an embodiment.
Figure 22:
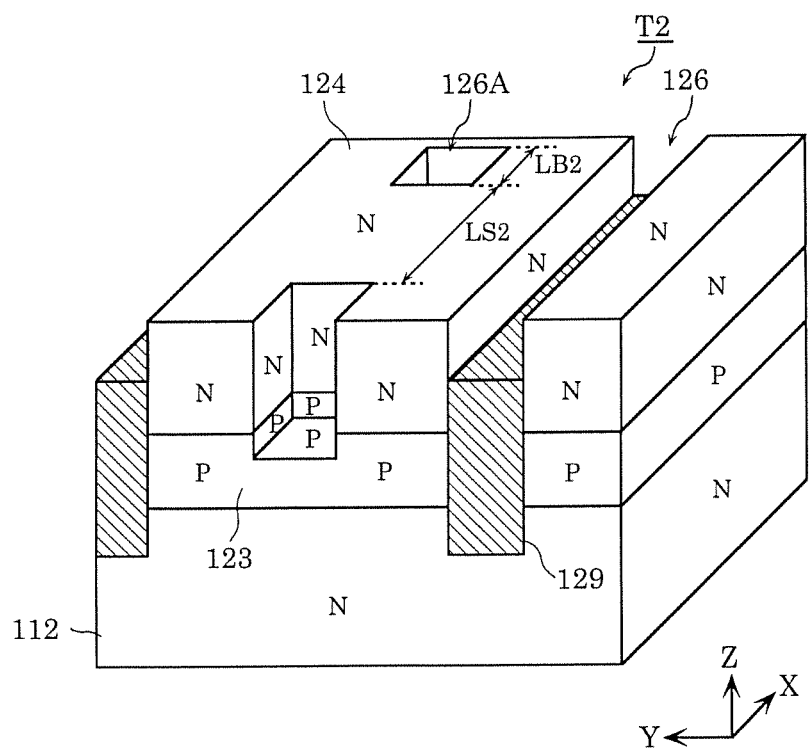
FIG. 22 is a perspective view of the configuration of an approximate single unit of the second transistor according to an embodiment.

The above-described second transistor T2 and fourth transistor T4 are exemplified as being orthogonal type vertical MOS transistors in FIG. 8 and FIG. 9, and parallel type vertical MOS transistors in FIG. 16 and FIG. 17, but either may be configured as a vertical bipolar transistor. FIG. 19 is a plan view and FIG. 20 is a perspective view of the configuration of an approximate single unit an orthogonal type vertical bipolar transistor, and FIG. 21 is a plan view and FIG. 22 is a perspective view of the configuration of an approximate single unit of a parallel type vertical bipolar transistor.

The configurations illustrated in FIG. 19, FIG. 20, FIG. 21, and FIG. 22 differ from the configurations illustrated in FIG. 8, FIG. 9, FIG. 16, and FIG. 17, respectively, in that second gate insulating films 127 and second gate conductors 128 are replaced with insulating layers 129. Moreover, drift layer 112, second body layer 123, and second source layer 124 respectively correspond to a collector layer, a base layer, and an emitter layer of a vertical bipolar transistor, semiconductor substrate 111 corresponds to a collector electrode, part of second body layer 123 (the deepest part at location 151 or location 152) corresponds to a base electrode, and first source electrode 115 corresponds to an emitter electrode.

These configurations are the equivalent of a state in which only parasitic bipolar transistor TP2 is present when second transistor T2 illustrated in FIG. 8, FIG. 9, FIG. 16, and FIG. 17 is configured as a vertical MOS transistor, so the same advantageous effects can be achieved as when second transistor T2 is configured as a vertical MOS transistor.

Note that insulating layers 129 need not necessarily be disposed in second trench parts 126; a structure in which the gate function of second transistor T2 is inactive is acceptable.

Moreover, first body layer 113 and second body layer 123 are desirably insulated and separated from each other, but may be conductive to the extent that there is no effect on actual operations.

Note that although the above description of the configuration of transistors referred to first transistor T1 and second transistor T2 as representatives, the same applies to the configurations of third transistor T3 and fourth transistor T4.

In other words, the above-described first transistor T1, parasitic bipolar transistor TP1, first body layer 113, first connection part 113A, first source layer 114, first trench parts 116, second transistor T2, parasitic bipolar transistor TP2, second body layer 123, second connection part 123A, second source layer 124, second trench parts 126, and first source electrode 115 can be respectively read as third transistor T3, parasitic bipolar transistor TP3, third body layer 133, third connection part, third source layer 134, third trench parts 136, fourth transistor T4, parasitic bipolar transistor TP4, fourth body layer 143, fourth connection part, fourth source layer 144, fourth trench parts 146, and second source electrode 135.

As described above, second transistor T2 is a vertical transistor (MOS transistor or bipolar transistor) formed on semiconductor substrate 111 and independent of parasitic bipolar transistor TP1. Second transistor T2 includes a first electrode (drain electrode or collector electrode) which is common drain electrode DC, a second electrode (source electrode or emitter electrode), and a third electrode (gate electrode or base electrode) that controls conductivity between the first electrode and the second electrode. The third electrode is electrically connected to the second electrode.

Similarly, fourth transistor T4 is a vertical transistor (MOS transistor or bipolar transistor) formed on semiconductor substrate 111 and independent of parasitic bipolar transistor TP3. Fourth transistor T4 includes a fourth electrode (drain electrode or collector electrode) which is common drain electrode DC, a fifth electrode (source electrode or emitter electrode), and a sixth electrode (gate electrode or base electrode) that controls conductivity between the fourth electrode and the fifth electrode. The sixth electrode is electrically connected to the fifth electrode.

[5. Method for Increasing Second Impedance]

Next, a method for increasing the second impedance to a value higher than the first impedance will be described. Method 1 below has already been described above, but other method examples are also listed.

<Method 1> Make LS2 greater than LS1.

<Method 2> Make the Y direction interval between adjacent second trench parts 126 less than the Y direction interval between adjacent first trench parts 116.

<Method 3> Make the thickness (the Z direction length) of second body layer 123 less than the thickness of first body layer 113.

<Method 4> Make the resistivity of second body layer 123 greater than the resistivity of first body layer 113.

<Method 5> Make the second conductivity type impurity concentration of second body layer 123 lower than the second conductivity type impurity concentration of first body layer 113.

<Method 6> Make the impurity concentration of the semiconductor layer included in second connection part 123A lower than the impurity concentration of the semiconductor layer included in first connection part 113A.

<Method 7> Include, in second connection part 123A, a high resistance layer that increases the impedance of second connection part 123A to an impedance higher than the impedance of first connection part 113A. The high resistance layer may comprise, for example, polysilicon.

In the above methods, LS1 and LS2 may be read as LS3 and LS4, respectively; first body layer 113 and second body layer 123 may be read as third body layer 133 and fourth body layer 143, respectively; first trench parts 116 and second trench parts 126 may be read as third trench parts 136 and fourth trench parts 146, respectively; and second connection part 123A and second body layer 123 may be read as fourth connection part and fourth body layer 143, respectively.

Method 2 can be applied in orthogonal type transistor configurations, and Method 3 through Method 7 can be applied in orthogonal type transistor configurations and parallel type transistor configurations.

Moreover, Method 1 through Method 7 may each be applied independently, or may be applied in combination with one or more other applicable methods. In either case, the second impedance can be made to be greater than the first impedance. Moreover, Method 1 through Method 7 can be applied even when second transistor T2 and fourth transistor T4 are configured as vertical bipolar transistors.

Moreover, in first transistor T1 or second transistor T2 illustrated in FIG. 7, FIG. 9, FIG. 15, FIG. 17, FIG. 20, and FIG. 22, one of, or a stacked structure of both of a semiconductor layer containing a second conductivity type impurity and an insulating film may be formed on first source layer 114, second source layer 124, first connection part 113A, and second connection part 123A.

Moreover, insulating layers may be formed on first gate conductors 118 in first trench parts 116, on second gate conductors 128 in second trench parts 126, on third gate conductors 138 in third trench parts 136, and on fourth gate conductors 148 in fourth trench parts 146.

INDUSTRIAL APPLICABILITY

The present disclosure is applicable in, for example, a CSP semiconductor device including a vertical field effect transistor.

What is claimed is:
1. A semiconductor device, comprising:
a first transistor, the first transistor being a vertical field effect transistor;
a second transistor, the second transistor being a vertical transistor; and
a first diode,
wherein the first transistor includes:
  a drift layer of a first conductivity type disposed on a semiconductor substrate;
  a first body layer of a second conductivity type different from the first conductivity type in an upper surface of the drift layer;
  a first source layer of the first conductivity type in an upper surface of the first body layer;
  a first source electrode electrically connected to the first source layer;
  a plurality of first trench parts, each of which extends in a first direction parallel to an upper surface of the semiconductor substrate and is selectively formed so as to, from the upper surface of the drift layer, penetrate through the first body layer and have a bottom in the drift layer;
  a plurality of first gate insulating films, each of which covers at least a portion of a surface of a corresponding first trench part from among the plurality of first trench parts;
  a plurality of first gate conductors, each of which is disposed on a corresponding first gate insulating film from among the plurality of first gate insulating films; and
  a first connection part that electrically connects the first body layer and the first source electrode,
the second transistor includes:
  a second body layer of the second conductivity type in the upper surface of the drift layer;
  a second source layer of the first conductivity type in an upper surface of the second body layer and electrically connected to the first source electrode; and
  a second connection part that electrically connects the second body layer and the first source electrode,
the first diode is electrically connected between the first source electrode and the plurality of first gate conductors, and
a second impedance is greater than a first impedance, the second impedance being, in a path between the second connection part and the second body layer, inclusive, a maximum impedance seen by the first source electrode in the second body layer, and the first impedance being, in a path between the first connection part and the first body layer, inclusive, a maximum impedance seen by the first source electrode in the first body layer.
2. The semiconductor device according to claim 1,
wherein the first source layer and the first connection part are alternately and repeatedly disposed in the first direction, and the second source layer and the second connection part are alternately and repeatedly disposed in the first direction.

3. The semiconductor device according to claim 2, wherein in the first direction, a length of the second source layer is greater than a length of the first source layer.

4. The semiconductor device according to claim 2, wherein in the first direction, a length of the second source layer is at least 24 times greater than a length of the second connection part.

5. The semiconductor device according to claim 2, wherein in the first direction, a length of the first source layer is at most 6 times greater than a length of the first connection part.

6. The semiconductor device according to claim 2, wherein the second transistor is a field effect transistor, and the second transistor further includes:
   a plurality of second trench parts, each of which extends in the first direction and is selectively formed so as to, from the upper surface of the drift layer, penetrate through the second body layer and have a bottom in the drift layer;
   a plurality of second gate insulating films, each of which covers at least a portion of a surface of a corresponding second trench part from among the plurality of second trench parts; and
   a plurality of second gate conductors, each of which is disposed on a corresponding second gate insulating film from among the plurality of second gate insulating films, and electrically connected to the first source electrode.

7. The semiconductor device according to claim 6, wherein in a second direction orthogonal to the first direction, a pitch between rows of the plurality of second trench parts is equal to a pitch between rows of the plurality of first trench parts.

8. The semiconductor device according to claim 6, wherein in a second direction orthogonal to the first direction, an interval between adjacent second trench parts from among the plurality of second trench parts is less than an interval between adjacent first trench parts from among the plurality of first trench parts.

9. The semiconductor device according to claim 2, wherein the second transistor is a bipolar transistor, the second transistor further includes:
   a plurality of second trench parts, each of which extends in the first direction and is selectively formed so as to, from the upper surface of the drift layer, penetrate through the second body layer and have a bottom in the drift layer, and
at least the first body layer and the second body layer are insulated and separated from each other.

10. The semiconductor device according to claim 9, wherein in a second direction orthogonal to the first direction, a pitch between rows of the plurality of second trench parts is equal to a pitch between rows of the plurality of first trench parts.

11. The semiconductor device according to claim 9, wherein in a second direction orthogonal to the first direction, an interval between adjacent second trench parts from among the plurality of second trench parts is less than an interval between adjacent first trench parts from among the plurality of first trench parts.

12. The semiconductor device according to claim 1, wherein a plurality of first source layers, each of which is the first source layer, are disposed between adjacent first trench parts from among the plurality of first trench parts, in a second direction orthogonal to the first direction,
the first connection part extends in the first direction and is disposed between adjacent first source layers from among the plurality of first source layers, and
a plurality of second connection parts, each of which is the second connection part, are disposed at regular intervals in the first direction.

13. The semiconductor device according to claim 12, wherein in the first direction, an interval between adjacent second connection parts from among the plurality of second connection parts is at least 24 times greater than a length of each of the plurality of second connection parts.

14. The semiconductor device according to claim 12, wherein the second transistor is a field effect transistor, and the second transistor further includes:
   a plurality of second trench parts, each of which extends in the first direction and is selectively formed so as to, from the upper surface of the drift layer, penetrate through the second body layer and have a bottom in the drift layer;
   a plurality of second gate insulating films, each of which covers at least a portion of a surface of a corresponding second trench part from among the plurality of second trench parts; and
   a plurality of second gate conductors, each of which is disposed on a corresponding second gate insulating film from among the plurality of second gate insulating films, and electrically connected to the first source electrode.

15. The semiconductor device according to claim 14, wherein in the second direction, a pitch between rows of the plurality of second trench parts is equal to a pitch between rows of the plurality of first trench parts.

16. The semiconductor device according to claim 14, wherein in the second direction, an interval between adjacent second trench parts from among the plurality of second trench parts is less than an interval between the adjacent first trench parts.

17. The semiconductor device according to claim 12, wherein the second transistor is a bipolar transistor, the second transistor further includes:
   a plurality of second trench parts, each of which extends in the first direction and is selectively formed so as to, from the upper surface of the drift layer, penetrate through the second body layer and have a bottom in the drift layer, and
at least the first body layer and the second body layer are insulated and separated from each other.

18. The semiconductor device according to claim 17, wherein in the second direction, a pitch between rows of the plurality of second trench parts is equal to a pitch between rows of the plurality of first trench parts.

19. The semiconductor device according to claim 17, wherein in the second direction, an interval between adjacent second trench parts from among the plurality of second trench parts is less than an interval between the adjacent first trench parts.

20. The semiconductor device according to claim 1, wherein a thickness of the second body layer is less than a thickness of the first body layer.

21. The semiconductor device according to claim 1, wherein an impurity concentration of an impurity of the second conductivity type in the second body layer is lower than an impurity concentration of an impurity of the second conductivity type in the first body layer.

22. The semiconductor device according to claim 1, wherein the second connection part includes a semiconductor layer having an impurity concentration that is lower than an impurity concentration of a semiconductor layer included in the first connection part.

23. The semiconductor device according to claim 1, wherein the second connection part includes a high resistance layer that increases an impedance of the second connection part to an impedance higher than an impedance of the first connection part.

24. The semiconductor device according to claim 1, wherein the first diode is a bidirectional zener diode comprising a combination of a polysilicon of the first conductivity type and a polysilicon of the second conductivity type, the bidirectional zener diode being disposed above and spaced apart from the upper surface of the semiconductor substrate.

25. The semiconductor device according to claim 1, further comprising:
a third transistor, the third transistor being a vertical field effect transistor;
a fourth transistor, the fourth transistor being a vertical transistor; and
a second diode,
wherein the third transistor includes:
a third body layer of the second conductivity type in the upper surface of the drift layer;
a third source layer of the first conductivity type in an upper surface of the third body layer;
a second source electrode electrically connected to the third source layer;
a plurality of third trench parts, each of which extends in the first direction and is selectively formed so as to, from the upper surface of the drift layer, penetrate through the third body layer and have a bottom in the drift layer;
a plurality of third gate insulating films, each of which covers at least a portion of a surface of a corresponding third trench part from among the plurality of third trench parts;
a plurality of third gate conductors, each of which is disposed on a corresponding third gate insulating film from among the plurality of third gate insulating films; and
a third connection part that electrically connects the third body layer and the second source electrode,
the fourth transistor includes:
a fourth body layer of the second conductivity type in the upper surface of the drift layer;
a fourth source layer of the first conductivity type in an upper surface of the fourth body layer and electrically connected to the second source electrode; and
a fourth connection part that electrically connects the fourth body layer and the second source electrode,
the second diode is electrically connected between the second source electrode and the plurality of third gate conductors, and
a fourth impedance is greater than a third impedance, the fourth impedance being, in a path between the fourth connection part and the fourth body layer, inclusive, a maximum impedance seen by the second source electrode in the fourth body layer, and the third impedance being, in a path between the third connection part and the third body layer, inclusive, a maximum impedance seen by the second source electrode in the third body layer.

26. The semiconductor device according to claim 25, further comprising:
a first gate terminal electrically connected to the plurality of first gate conductors and exposed on an upper surface of the semiconductor device;
a second gate terminal electrically connected to the plurality of third gate conductors and exposed on the upper surface of the semiconductor device;
a first source terminal electrically connected to the first source electrode and exposed on the upper surface of the semiconductor device; and
a second source terminal electrically connected to the second source electrode and exposed on the upper surface of the semiconductor device,
wherein the second transistor is disposed between the first gate terminal and the second source terminal in a plan view, and
the fourth transistor is disposed between the second gate terminal and the first source terminal in a plan view.

27. The semiconductor device according to claim 25, wherein the second transistor and the fourth transistor are disposed between the first transistor and the third transistor in a plan view.

28. A semiconductor device disposed on a semiconductor substrate, the semiconductor device comprising:
a first transistor disposed on the semiconductor substrate and including a common drain electrode, a first source electrode, and a first gate electrode, the first transistor being a vertical field effect transistor;
a second transistor disposed on the semiconductor substrate and including a first electrode electrically connected to the common drain electrode, a second electrode electrically connected to the first source electrode, and a third electrode that controls conductivity between the first electrode and the second electrode, the second transistor being a vertical transistor that is independent of a parasitic transistor included in the first transistor;
a third transistor disposed on the semiconductor substrate and including the common drain electrode, a second source electrode, and a second gate electrode, the third transistor being a vertical field effect transistor;
a fourth transistor disposed on the semiconductor substrate and including a fourth electrode electrically connected to the common drain electrode, a fifth electrode electrically connected to the second source electrode, and a sixth electrode that controls conductivity between the fourth electrode and the fifth electrode, the fourth transistor being a vertical transistor that is independent of a parasitic transistor included in the third transistor;
a first diode electrically connected between the first source electrode and the first gate electrode; and
a second diode electrically connected between the second source electrode and the second gate electrode,
wherein the third electrode is electrically connected to the first source electrode,
the second transistor:
is not conducting from the first electrode to the second electrode when the semiconductor device is normally operating; and
is conducting from the first electrode to the second electrode when an electro-static discharge (ESD) surge voltage is applied between the second source electrode and the first gate electrode, the sixth electrode is electrically connected to the second source electrode, the fourth transistor:
is not conducting from the fourth electrode to the fifth electrode when the semiconductor device is normally operating; and
is conducting from the fourth electrode to the fifth electrode when an ESD surge voltage is applied between the first source electrode and the second gate electrode, the semiconductor device further comprises:
a first gate terminal electrically connected to the first gate electrode and exposed on an upper surface of the semiconductor device;
a second gate terminal electrically connected to the second gate electrode and exposed on the upper surface of the semiconductor device;
a first source terminal electrically connected to the first source electrode and exposed on the upper surface of the semiconductor device; and
a second source terminal electrically connected to the second source electrode and exposed on the upper surface of the semiconductor device, the second transistor is disposed between the first gate terminal and the second source terminal in a plan view, and the fourth transistor is disposed between the second gate terminal and the first source terminal in a plan view.

29. A semiconductor device disposed on a semiconductor substrate, the semiconductor device comprising:
a first transistor disposed on the semiconductor substrate and including a common drain electrode, a first source electrode, and a first gate electrode, the first transistor being a vertical field effect transistor;
a second transistor disposed on the semiconductor substrate and including a first electrode electrically connected to the common drain electrode, a second electrode electrically connected to the first source electrode, and a third electrode that controls conductivity between the first electrode and the second electrode, the second transistor being a vertical transistor that is independent of a parasitic transistor included in the first transistor;
a third transistor disposed on the semiconductor substrate and including the common drain electrode, a second source electrode, and a second gate electrode, the third transistor being a vertical field effect transistor;
a fourth transistor disposed on the semiconductor substrate and including a fourth electrode electrically connected to the common drain electrode, a fifth electrode electrically connected to the second source electrode, and a sixth electrode that controls conductivity between the fourth electrode and the fifth electrode, the fourth transistor being a vertical transistor that is independent of a parasitic transistor included in the third transistor;
a first diode electrically connected between the first source electrode and the first gate electrode; and
a second diode electrically connected between the second source electrode and the second gate electrode, wherein the third electrode is electrically connected to the first source electrode, the second transistor:
is not conducting from the first electrode to the second electrode when the semiconductor device is normally operating; and
is conducting from the first electrode to the second electrode when an electro-static discharge (ESD) surge voltage is applied between the second source electrode and the first gate electrode, the sixth electrode is electrically connected to the second source electrode, the fourth transistor:
is not conducting from the fourth electrode to the fifth electrode when the semiconductor device is normally operating; and
is conducting from the fourth electrode to the fifth electrode when an ESD surge voltage is applied between the first source electrode and the second gate electrode, and the second transistor and the fourth transistor are disposed between the first transistor and the third transistor in a plan view.

* * * * *